United States Patent [19]
John

[11] Patent Number: 5,867,422
[45] Date of Patent: Feb. 2, 1999

[54] COMPUTER MEMORY CHIP WITH FIELD PROGRAMMABLE MEMORY CELL ARRAYS (FPMCAS), AND METHOD OF CONFIGURING

[75] Inventor: Lizy Kurian John, Tampa, Fla.

[73] Assignee: University of South Florida, Tampa, Fla.

[21] Appl. No.: 512,505

[22] Filed: Aug. 8, 1995

[51] Int. Cl.$^6$ ............................................. G11C 13/00
[52] U.S. Cl. ............... 365/168; 365/189.01; 365/189.08
[58] Field of Search ................. 365/189.01, 189.08, 365/230.03

[56] References Cited

U.S. PATENT DOCUMENTS

| | | | |
|---|---|---|---|
| 4,622,648 | 11/1986 | S. Whitaker ............................ | 364/715 |
| 4,758,745 | 7/1988 | Elgamal et al. ........................ | 307/465 |
| 4,873,459 | 10/1989 | El Gamal et al. ...................... | 307/465 |
| 5,021,689 | 6/1991 | Pickett et al. .......................... | 307/465 |
| 5,144,582 | 9/1992 | R. Steele ................................. | 365/189 |
| 5,237,219 | 8/1993 | R. Cliff .................................... | 307/465 |
| 5,255,221 | 10/1993 | D. Hill .................................... | 365/189.08 |
| 5,307,320 | 4/1994 | S. Farrer ............................... | 365/230.01 |
| 5,317,212 | 5/1984 | S. Wahlstrom ......................... | 307/465 |
| 5,331,226 | 7/1994 | F. Goetting ............................. | 307/465 |

OTHER PUBLICATIONS

IEEE Spectrum –Oct., 1992 "Memory Catches Up", pp. 34–35.
IEEE Spectrum –Oct., 1992 "Fast computer memories", pp. 36–39.
IEE Spectrum =Oct., 1992 "Fast DRAMs for Sharper TV", pp. 40–42.
IEEE Spctrum –Oct., 1992 "A new era of fast dynamic RAMs", pp. 43–45.
IEEE Spectrum –Oct., 1992 "We see your expectations of visualization and we raise them" 46–49.
IEEE Spectrum –Oct., 1992 "A fast path to one memory", pp. 50–51.
IEEE Spctrum –Oct., 1992 "A RAM link for high speed", pp. 52–53.
IEEE Spectrum –Oct., 19921 "Fast interfaces for DRAMs", pp. 54–57.
IEEE Spectrum –Feb., 1994 "Memory in the fast lane", pp. 38–41.
Computer Design –Mar., 1993 Wen Jai Hsieh on: Reconfigurable hardware, pp. 27–28 and 30.
Computer Design –Mar., 1993 "Cache architectures under pressure to match CPU performance", pp. 91–97.
Motorola, Inc. 1993 Product Review "64K ×18 Bit BurstRAM Synchronous Fast Static RAM With Burst Counter and Self–Timed Write".
Motorola Semiconductor Technical Data –Product Review 1m×4/2m×2 Bit Fast Static Random Access Memory with ECL I/O.

*Primary Examiner*—Terrell W. Fears
*Attorney, Agent, or Firm*—Stein, Schifino & Van Der Wall

[57] ABSTRACT

A programmable memory circuit including the facility to reconfigure it's format

10 Claims, 8 Drawing Sheets

| MC4 | MC3 | MC2 | MC1 | a3 | a2 | a1 | a0 | $\overline{a3}$ | $\overline{a2}$ | $\overline{a1}$ | $\overline{a0}$ | Configuration |
|---|---|---|---|---|---|---|---|---|---|---|---|---|
| 1 | 1 | 1 | 1 | A19 | A18 | A17 | A16 | $\overline{A19}$ | $\overline{A18}$ | $\overline{A17}$ | $\overline{A16}$ | 1 bit wide |
| 1 | 1 | 1 | 0 | H | A18 | A17 | A16 | H | $\overline{A18}$ | $\overline{A17}$ | $\overline{A16}$ | 2 bit wide |
| 1 | 1 | 0 | 0 | H | H | A17 | A16 | H | H | $\overline{A17}$ | $\overline{A16}$ | 4 bit wide |
| 1 | 0 | 0 | 0 | H | H | H | A16 | H | H | H | $\overline{A16}$ | 8 bit wide |
| 0 | 0 | 0 | 0 | H | H | H | H | H | H | H | H | 16 bit wide |

FIG. 6

| M3 | M2 | M1 | MC4 | MC3 | MC2 | MC1 |
|----|----|----|-----|-----|-----|-----|
| 0  | 0  | 0  | 0   | 0   | 0   | 0   |
| 0  | 0  | 1  | 1   | 0   | 0   | 0   |
| 0  | 1  | 0  | 1   | 1   | 0   | 0   |
| 0  | 1  | 1  | 1   | 1   | 1   | 0   |
| 1  | 0  | 0  | 1   | 1   | 1   | 1   |

Configuration RAM contents | Resulting Configuration

| 0 | 0 | 0 | 0 |

16 bit wide

| 1 | 0 | 0 | 0 |

8 bit wide

| 1 | 1 | 0 | 0 |

4 bit wide

| 1 | 1 | 1 | 0 |

2 bit wide

| 1 | 1 | 1 | 1 |
   S3  S2  S1  S0

1 bit wide

FIG. 9

| M | A19 | A18 | A17 | A16 | MC4 | MC3 | MC2 | MC1 | Configuration |
|---|-----|-----|-----|-----|-----|-----|-----|-----|---------------|
| 0 | x   | x   | x   | x   | 1   | 1   | 1   | 1   | 1 bit wide    |
| 1 | 0   | x   | x   | x   | 1   | 1   | 1   | 0   | 2 bit wide    |
| 1 | 1   | 0   | x   | x   | 1   | 1   | 0   | 0   | 4 bit wide    |
| 1 | 1   | 1   | 0   | x   | 1   | 0   | 0   | 0   | 8 bit wide    |
| 1 | 1   | 1   | 1   | x   | 0   | 0   | 0   | 0   | 16 bit wide   |

FIG. 10

COMPUTER MEMORY CHIP WITH FIELD PROGRAMMABLE MEMORY CELL ARRAYS (FPMCAS), AND METHOD OF CONFIGURING

BACKGROUD OF THE INVENTION

1. Field of the Invention

This invention relates to a programmable computer memory chip and to a method of dynamically configuring the memory chip to different I/O bus widths.

2. Description of the Background Art

As shown in FIG. 1, conventional computer random access memory (RAM) chip 10 contains a memory array 12 having memory cells that can each be individually addressed by a row decoder 14 and a column decoder 16 to input or output data by means of I/O circuits 18 and input and output data control circuits 20 and 22, respectively as determined by chip select/write enable logic, generally indicated by numeral 24. Most of these chips 10 organize the memory cells in a matrix fashion and employ a decoding scheme utilizing the row and column decoders 14 & 16. More particularly, approximately one-half the address lines 26 are decoded by the row decoder 14 and the remaining address lines 28 are decoded by the column decoder 16.

For example, a 1 Mb (megabits of memory)×1 (word width of 1) chip has 1048576 cells divided into 1024 rows and 1024 columns. There are 20 address lines, 10 of which are used to select one of the 1024 rows of memory cells. The remaining 10 bits are used as column address inputs to select one of the 1024 columns. The row decoder 14 has 10 inputs and 1024 outputs. The column decoder also has 10 inputs and 1024 outputs. For any specific address, only one of the 1024 rows and only one of the 1024 columns will be activated, and only one cell gets active row and column address and the output of that cell will appear at the memory output. The I/O circuit 18 permits a stored bit to be output to the data output pin 22 during a read and to be changed by the input 20 from the data during a write. In dynamic RAMs, the I/O circuits 28 will include sense amplifiers, etc.

Several innovative static RAM (SRAM) and dynamic RAM (DRAM) architectures have been proposed recently, examples being fast static RAMs from Motorola such as BurstRAMs and DSPRAMs, the cached DRAM from Mitsubishi and Ramtron, the synchronous DRAM from the Joint Electron Devices Engineering Council (Jedec) and in the Rambus and Ramlink architectures (B. Prince, "Memory in the fast lane", IEEE Spectrum, February 1994, pp. 38–41; W. J. Hsieh, "Reconfigurable Hardware", Computer Design, March 1993, pp. 27–30). The key feature in many of these architectures is that the I/O architecture of a RAM is modified so that rapid bursts of data may issue from the internal RAM bus without having to wait the entire access cycle. RAMs are often built as a square or rectangular array of cells, and the processor first sends a row address and then a column address to specify the cell address. To raise their operating mode, DRAMs have a special operating mode that takes advantage of the internal row-and-column structure, known as the page mode (B. Prince, "Memory in the fast lane", IEEE Spectrum, February 1994, pp. 38–413). In this mode, an entire row is read into the sense amplifiers, the row may be kept active and column addresses changed to access all the data. As long as the accesses remain in the same row, the DRAM can work faster.

The fact that the word width of existing memory chips are fixed, creates a granularity problem in wide-bus memory systems Granularity is the minimum increment of memory that may be added to a system. Personal computers and workstations normally use Single In-line Memory Modules (SIMMs), which are small printed circuit boards stocked with multiple RAM chips arranged in parallel to yield a word width of 32 to 144 bits, matching the memory system word width to the processor's bus width. Hence, memory granularity can sometimes be very troublesome (B. Prince, "Memory in the fast lane", IEEE Spectrum, February 1994, pp. 38–41).

Memory granularity increases as the word width of the memory chip becomes narrower with respect to the memory bus. Quoting the example used by Prince, in a 16-bit wide bus that uses 4 Mb DRAMs, if the chips are organized as 1 M×4 bits, then it takes four of them to fill out the 16-bit memory bus with a minimum granularity of 2 MByte (1 Byte=8 bits) of memory ((1024×1024×4)bits/chip×4 chips÷8 bits\Byte=2 MByte). If, however, the memory chip is organized as 4M×1 bits, then 16 of them are needed to fill out a 16-bit bus with a minimum granularity of 8 MBytes of memory. The width of the chips used thus affects the expandability of the memory system.

It is desirable to be able to configure the memory chip to a different widths. The only known memory chip that is capable of being reconfigured is the Motorola 1M×4/2M×2 bit Fast Static RAM memory chip (Part Number MCM101524). This Motorola chip is a 4 Mb RAM whose I/O can be electrically reconfigured from a normal configuration as 1M×4 bits to 2M×2 bits by applying power supply voltage to a mode select pin on the chip. Unfortunately, no other reconfigurations are possible.

Therefore, it is an object of this invention to provide an improvement which overcomes the aforementioned inadequacies of the prior art memory chips and provides an improvement which is a significant contribution to the advancement of the memory chip art.

Another object of this invention is to provide a memory chip of N cells that may be dynamically reconfigured to N×1 bit, N/2×2 bits, N/4×4 bits or in general, N/k×k bits, where k is a power of two.

Another object of this invention is to provide a new and useful method for dynamically reconfiguring a computer memory chip of N cells to N×1 bit, N/2×2 bits, N/4×4 bits or in general, N/k×k bits, where k is a power of two.

The foregoing has outlined some of the pertinent objects of the invention. These objects should be construed to merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention made be had by referring to the following summary and the detailed description of the preferred embodiment of the invention, taken in conjunction with the accompanying drawings.

SUMMARY OF THE INVENTION

For the purpose of summarizing this invention, this invention comprises a new and useful computer memory chip, referred to herein as a Field Programmable Memory Cell Array (FPMCA) chip. The FPMCA chip of the invention includes a plurality of memory cells in a predetermined arrangement, a programmable address decoder to enable the memory cells to be addressed and a programmable interconnect having a plurality of programmable connection devices to enable the I/O to be interfaced to a processor. According to one preferred embodiment, the programmable address decoder comprises multiplexers and decoders for addressing the memory cells of the chip and the programmable connection devices comprises PASS transistors for reconfiguring the I/O of the chip.

A method for configuring a computer memory chip, according to the present invention, comprises providing a FPMCA chip as described above, and programming the programmable address decoder and the connection devices as described above so as to reconfigure the arrangement of the memory cells to a selected configuration, and to configure the control logic to interface the memory cells in that selected configuration to a processor in a predetermined manner.

The FPMCA chip of the invention, and the corresponding method for reconfiguring the FPMCA chip, achieves the desired objective of providing a memory chip of N cells that may be dynamically reconfigured to N×1 bit, N/2×2 bits, N/4×4 bits or in general, N/k×k bits, where k is a power of two.

The FPMCA chip of the invention will therefore add more flexibility to all uses of memory chips. Memory manufacturers need not make X1, X4, X16 and X32 chips. Only one generic array need be manufactured, and then the generic memory array can be easily programmed to the desired configuration.

Additionally, FPMCA chips of the invention can be used as variable-width memory chips, dynamically configurable caches, dynamically alterable interleaving schemes and other reconfigurable memory architectures.

Accordingly, it should be appreciated that the design of the programmable circuitry allows the use of the FPMCA chip in a variety of different modes since the FPMCA chip can be reconfigured to several different widths and can be interfaced to different processors with different bus widths.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which:

FIG. 6 is a logic chart illustrating the input and outputs of the control logic in FIG. 5A;

FIG. 9 is a block diagram listing the values for the select signals to the programmable I/O controller for achieving five different configurations of the FPMCA chip of the invention; and FIG. 10 is a decoding chart illustrating how address pins can be combined with mode pins to minimize the number of necessary pins on the FPMCA chip of the invention.

Similar reference characters refer to similar parts throughout the several views of the drawings.

DETAILED DESCRIPTION OF THE PREFERRED EMBODIMENT

Figure 1:
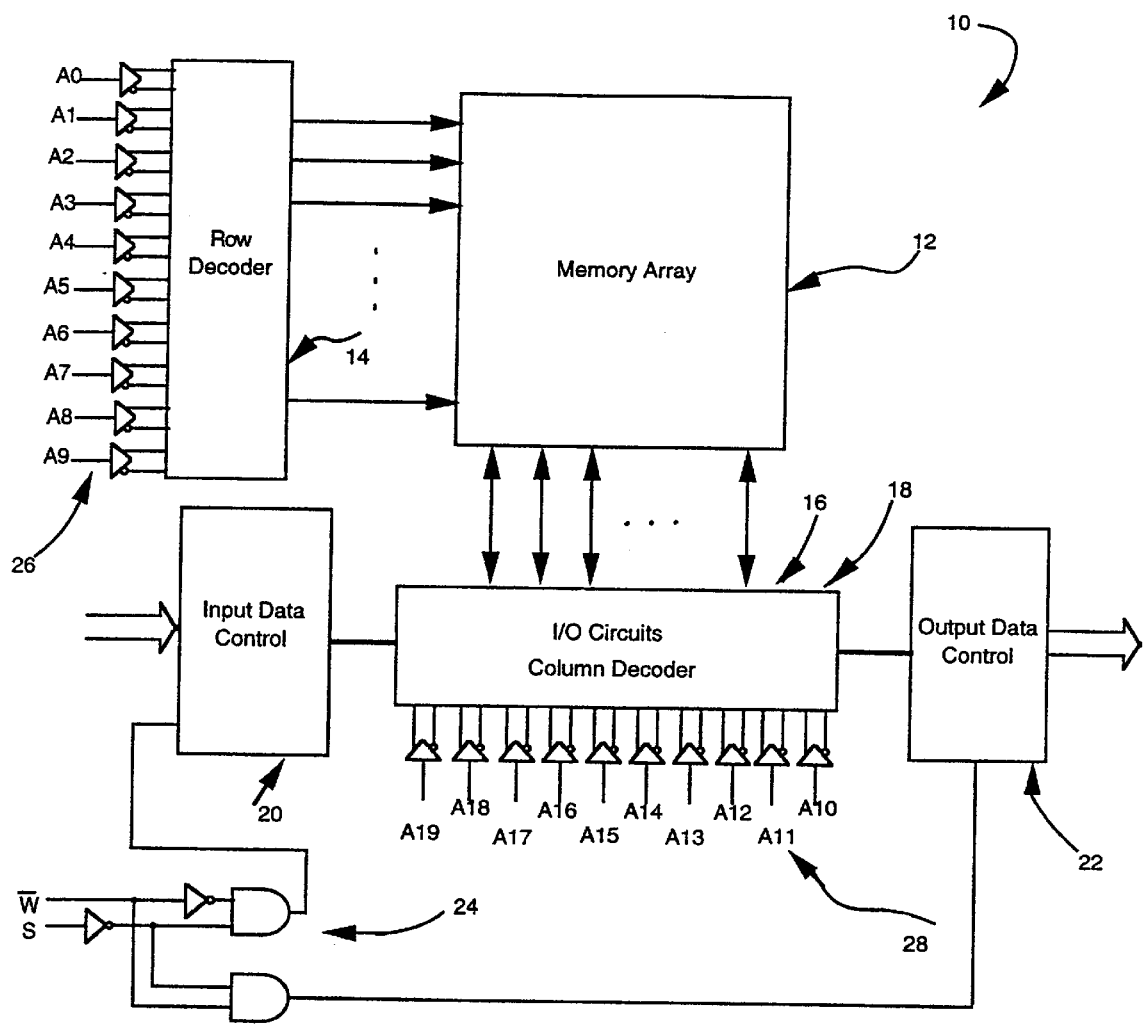
FIG. 1 is a block diagram illustrating the organization of a typical memory chip according to the prior art.

As shown in FIG. 1, the field programmable memory cell array (FPMCA) chip 30 of the invention conventionally comprises, as described above, a memory array 12 addressed by a row decoder 14 and a column decoder 16 to input or output data by means of I/O circuits 18 and input and output data control circuits 20 and 22, respectively, as determined by chip select/write enable logic, generally indicated by numeral 24.

Figure 3:
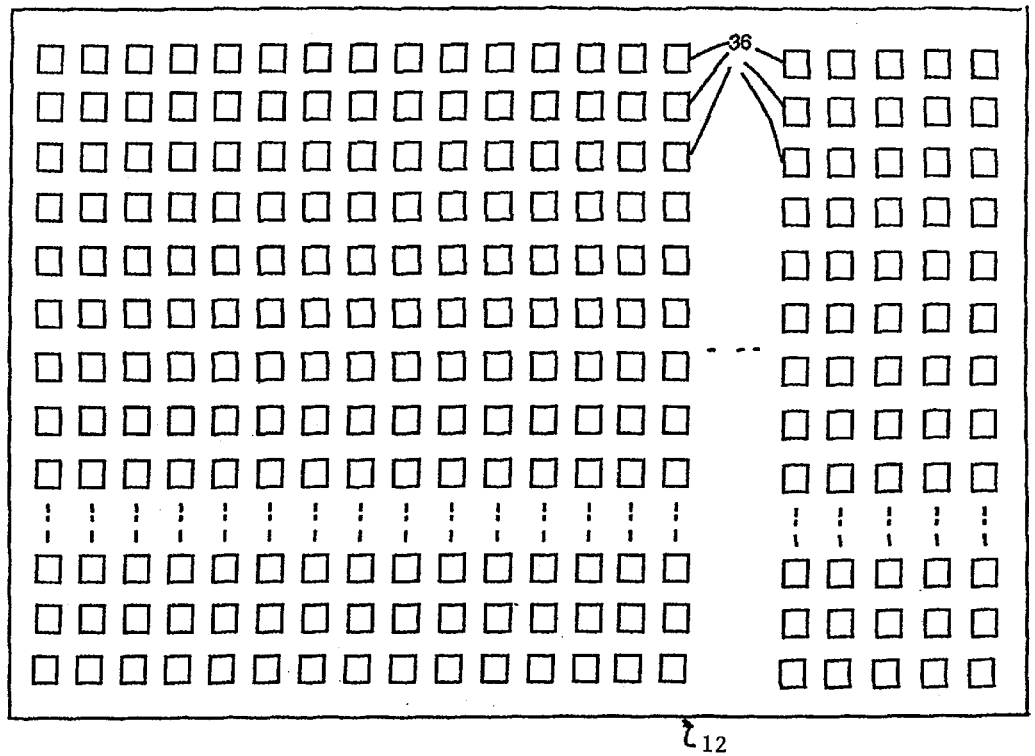
FIG. 3 is a block diagram illustrating a fully programmable memory cell array according to the present invention in which a sea-of-memory-cells along with a programmable interconnect is present inside the chip.

The inventive concept of the FPMCA chip 30 of the invention is the inclusion of a programmable address decoder 32 (see FIG. 5) and programmable interconnect 34 (see FIG. 8) that allow selective reconfiguration of the sea of N memory cells 36 (see FIG. 3) of the FPMCA chip 30 to N×1 bit, N/2×2 bits, N/4×4 bits or in general, N/k×k bits, where k is a power of two.

Figure 4:
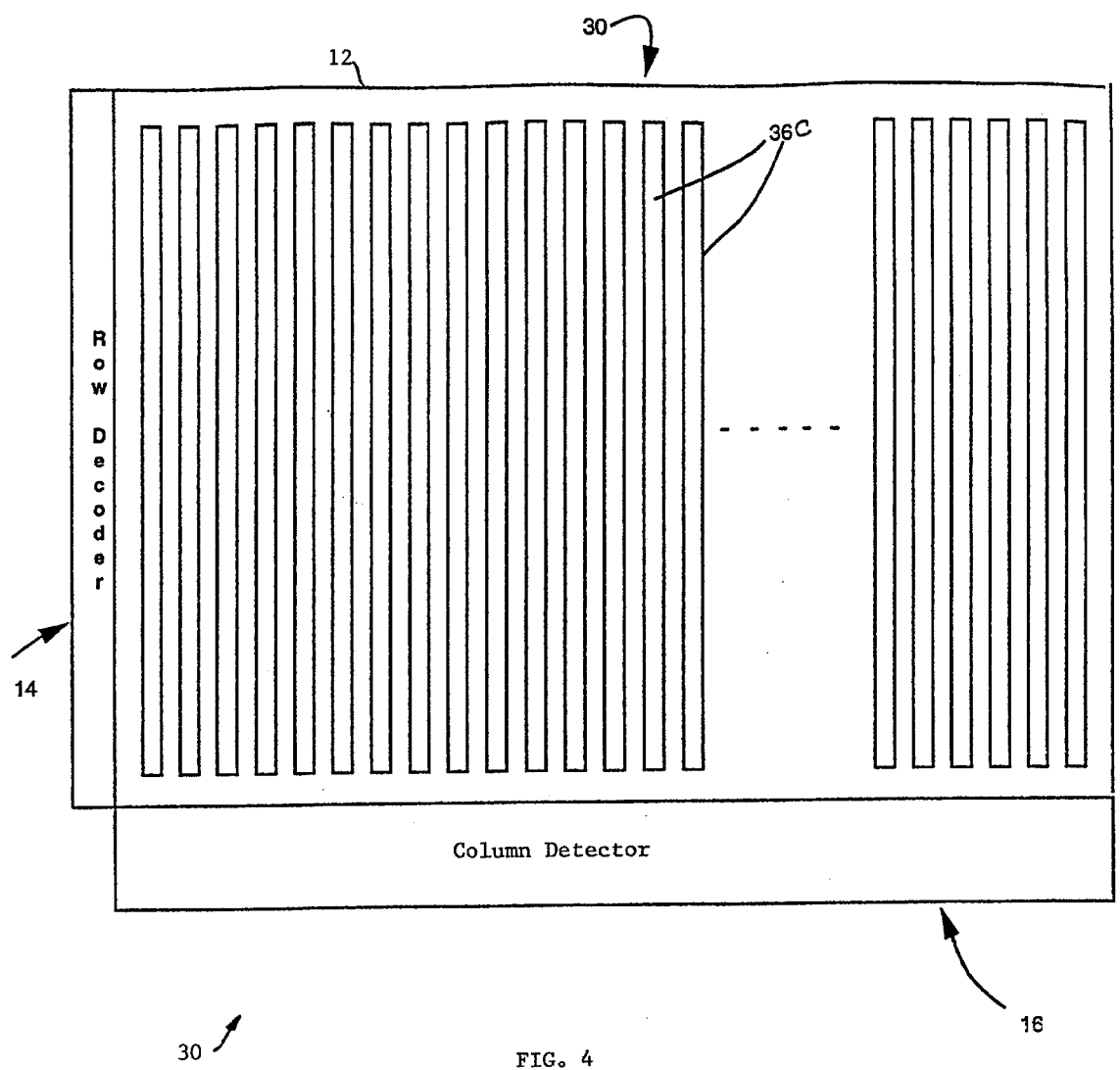
FIG. 4 is a block diagram illustrating the design of a FPMCA chip according to the present invention, with programmable column decoder and data width.

FIG. 4 is a block diagram of one embodiment of the FPMCA chip 30 according to the present invention. The FPMCA chip 30 has a hard-wired or rigid row decoder 14 and has a column decoder 16 that comprises the programmable address decoder 32 of the invention. Those skilled in the art will realize that several designs allowing for different levels of programmability in either row or column decoder or both can be realized by incorporating the principles of the present invention.

For purposes of explaining the present invention, a 1M×1 bit chip is assumed. When the word width is increased to double the existing width, the number of address lines is reduced by one. Thus, when the word width increases k times, the number of address lines gets reduced by log(k). The reconfigurable FPMCA chip 30 supports the number of data pins corresponding to the largest width to be supported and the number address pins corresponding to the smallest width. In the embodiment in FIG. 4, assume that the 1M×1 bit chip is to be reconfigurable to 512K×2 bits, or 256K×4 bits, or 128K×8 bits, or 64K×16 bits. In the different configurations, 20, 19, 18, 17, or 16 address pins and 1, 2, 4, 8, 16 data pins respectively, are required. The twenty address pins are designated A0, A1, A2, . . . A19. The lower 10 address pins A0, A1, . . . A9 are connected to the row decoder 14. The higher 10 address bits, A10, A11, . . . A19 are connected to the column decoder 16. The row decoder 14 is hardwired, so it will always have 10 address bits. The column decoder 16 will use 10, 9, 8, 7, and 6 bits when the word width of the chip is 1, 2, 4, 8, and 16 bits respectively.

The purpose of the programmable address decoder 32 and the programmable interconnect 34 is to configure the word width to the desired width and correspondingly configure the column decoder, column address pins and data pins.

Programmable Address Decoder

Figure 2A:
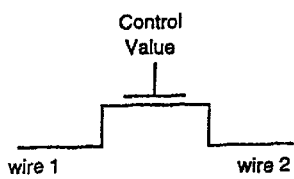
FIGS. 2A, B and C are block diagrams illustrating the use of a PASS transistor, transmission gate and multiplexer for reconfigurable interconnect according to the prior art.
Figure 2B:
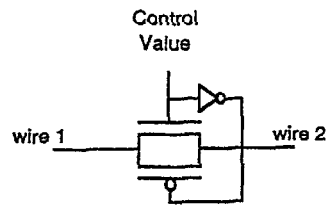
Figure 2C:
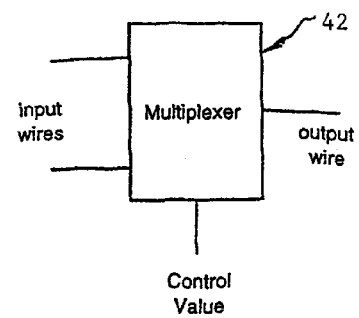

The programmable address decoder 32 of the invention comprises four mode control lines 38 (MC1, . . . MC4) connected to the control inputs 40 of four paired demultiplexers 42 (see FIG. A of FIG. 5 and also FIG. 2C). The data input 44 of one of each paired demultiplexers 42 is respectively connected to the four column address lines 28 (A1, . . . A19) and the data input 46 of the other of each paired demultiplexers 42 is respectively connected to the complement of such column address lines 28 ($\overline{A16}$, . . . $\overline{A19}$). The other data inputs 48 of each of the demultiplexers 42 are held high H.

Figure 5:
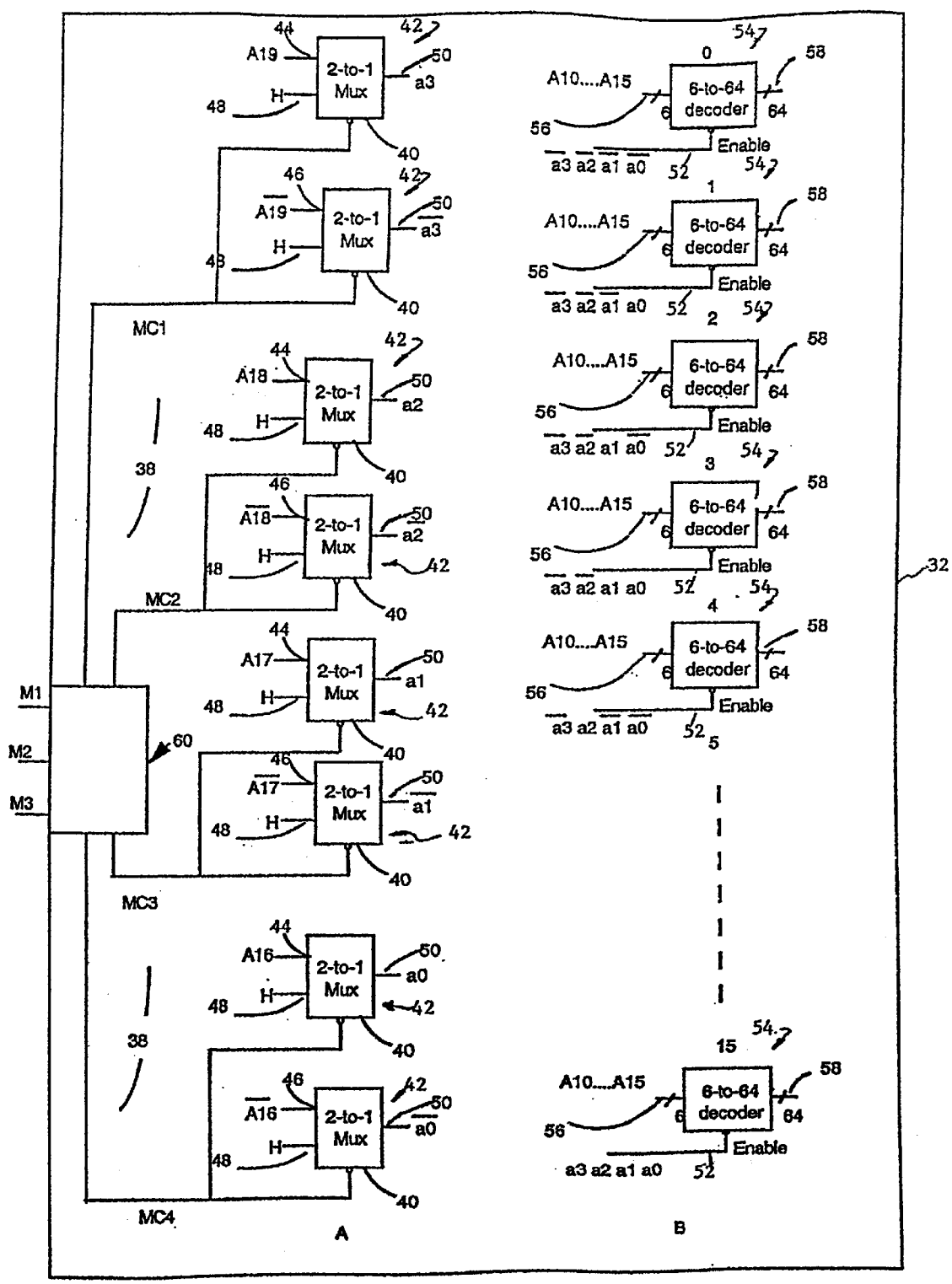
FIG. 5 is a block diagram illustrating the programmable address decoders of the invention as including demultiplexers and decoders.

The output terminals 50 (labeled a0, $\overline{a0}$, . . . a3, $\overline{a3}$ for convenience) of the demultiplexers 42 are logically connected as indicated in FIG. B of FIG. 5 to the enable inputs 52 of sixteen 6×64 decoders 54. The remaining six column address lines 28 (A10, . . . A15) are respectively connected to the six inputs 56 of the each of the sixteen decoders 54. The 1024 outputs 58 of the sixteen 6×64 decoders 54 (16×64=1024) are respectively connected to the columns 36C of the memory array 12.

It is noted that since there are sixteen 6×64 decoders 54 and since they are enabled depending upon the logic state of the four mode control lines 38, only 1, 2, 4, 8 or 16 of such decoders 54 will be enabled at any one time. Further, since only one of the outputs 58 of the enabled decoders 56 may will high depending upon the respective inputs 56, only 1, 2, 4, 8, or 16 columns 36C of the memory array 12 are addressed. With 1, 2, 4, 8, or 16 columns of the memory cells 36 being addressed, the word length of the FPMCA chip 30 may be 1, 2, 4, 8, or 16 bits wide (see the logic table of FIG. 6).

Since there are five different modes to be supported, at least three external mode pins are required for mode control. More specifically, as shown in the logic table of FIG. 7, the three external mode pins (M1, M2, M3) may be translated by suitable logic 60 (see FIG. 5), to the four mode control lines (MC1, MC2, MC3, MC4).

Programmable Interconnect

Figures 7, 8:
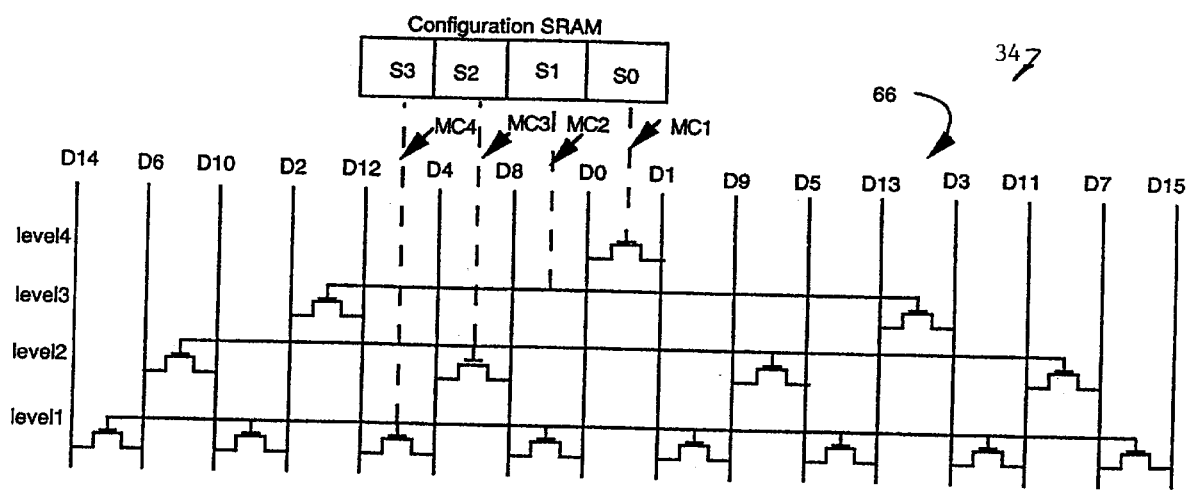
FIG. 7 is a decoding chart illustrating the generation of select signals for the multiplexers of FIG. 5A from three mode pins.
FIG. 8 is a schematic diagram illustrating the programmable connection devices for reconfiguring the I/O width of the FPMCA chip of the invention.

Referring now to FIG. 8, the output circuitry of the 16-bit wide FPMCA chip can be programmed to 8, or 4, or 2, or 1 bit word widths by means of a PASS transistors 62 (see FIG. 2A) or a transmission gate 64 (see FIG. 2B), or other suitable switch. More particularly, PASS transistors 62 are placed between the data lines 66 of the I/O circuits of the FPMCA chip 30 so that they can be connected together or not, depending on the desired word width. As illustrated, four levels of PASS transistors are required to change the word width to include 1, 2, 4, 8 and 16 widths.

In general, log(k) levels of PASS transistors 62 are required for varying the word width to k times. In fact, all of the PASS transistors 62 in any one level will be having identical contents. This principle may be used to reduce the number of mode control lines used in the circuit. The PASS transistors 62 can be programmed to the aforementioned level of flexibility by log(k) control lines, one for each level of PASS transistors 62.

FIG. 8 illustrates the manner in which sixteen data lines 66 can be controlled by the four mode control lines 38 (described above in connection with the programmable address decoder 32) to yield any word width from 16, 8, 4, 2 to 1, which are powers of two. FIG. 9 illustrates the values required to control the PASS transistors 62. It is noted that a circuit similar to FIG. 8 has to be incorporated into the input circuitry also. The mode control lines 38 controlling the PASS transistors in the input data lines can be the same as those in the output circuitry.

At this point it is noted that the mode control lines 38 for the programmable address decoder 32 has identical values as the mode control lines for word-width adjustment and hence the same lines may be used. The mode control lines could be replaced by a mode control register built of static RAM cells (as in Xilinx FPGAs). In an embodiment that uses the static RAM cells to control the chip width, the values in the static RAM cells will correspond to FIG. 9.

Looking at the values on the mode control lines 38 as in FIG. 9, it can be seen that out of the 16 possible values for the 4 mode control lines, only 5 are being used. In general, out of all possible k combinations of contents for the log(k) select lines, only log(k)+1 combinations are being used. Hence the number of control lines may be minimized to log (log(k)+1). Thus just 3 lines are sufficient for programming from 1 bit to 16 bit. From 3 lines, the four control signals can be generated according to FIG. 7. Even in a case for programming from 1 bit to 1024 bit width, all that is required is 4 lines.

Finally, as shown in FIG. 10, the log (log(k)+1) lines or 4 control lines in the embodiment in FIG. 4 can be overlapped with the address bits. Specifically, each increase in the data width by k times, reduces the number of address lines required by log(k). Those lines can be shared to deliver the mode information to the chip. FIG. 10 illustrates the manner in which the address lines and the mode control bits can be shared. Only one extra line will be required to indicate the mode. That line if 0 commands the chip to be in the narrowest possible configuration. If the line is 1, the chip is in a wider mode. Hence at least the highest address line A20 is not required for addressing. So A20 can be used for mode information. If A20 is 0, the chip is twice as wide as the narrowest configuration. If A20 is a 1, the chip is even wider. So A19 is not required for addressing and will be used for mode information. If A19 is 0, the chip is 4 times as wide as the narrowest configuration. If A19 is 1, the chip is wider than 4 times the original width. So A18 will not be required for addressing and can be used for mode information. If A18 is a 0, the chip is 8 times the original width and if A18 is a 1, the chip is 16 times the original width. Thus mode control can be accomplished by just one extra pin. Even that one pin can be overlapped with some of the data pins.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A field programmable memory cell array including a memory array composed of a sea of N memory cells addressed by a row decoder and a column decoder to input or output data by means of input/output circuits, input data control circuits and output data control circuits as determined by select/write enable logic, comprising in combination a programmable address decoder and a programmable interconnect for selective reconfiguration of the sea of N memory cells to N/k×k bits, where k is a power of two.

2. The field programmable memory cell array of claim 1, wherein said programmable address decoder comprises a plurality of mode control lines respectively connected to control inputs of a plurality of paired demultiplexers, with one data input of each of said paired demultiplexers being respectively connected to four column address lines and the other data input of each of said paired demultiplexers being respectively connected to the complement of said column address lines and with outputs of said demultiplexers being logically connected to enable inputs of the column decoder such that k columns of the memory cells are addressed thereby defining a word width of k bits wide.

3. The field programmable memory cell array of claim 2, wherein said programmable interconnect comprises a plurality of switches, controlled by said mode control lines, connected between respective data lines of the input/output circuits to yield a word width of k bits wide.

4. The field programmable memory cell array of claim 3, wherein said switches comprise PASS transistors.

5. The field programmable memory cell array of claim 1, wherein said programmable interconnect comprises a plurality of switches, controlled by a plurality of mode control lines, connected between respective data lines of the input/output circuits to yield a word width of k bits wide.

6. The field programmable memory cell array of claim 5, wherein said switches comprise PASS transistors.

7. The field programmable memory cell array of claim 5, wherein said programmable address decoder comprises a plurality of paired demultiplexers, with said mode control lines respectively connected to control inputs thereof, with one data input of each of said paired demultiplexers being respectively connected to four column address lines and the other data input of each of said paired demultiplexers being respectively connected to the complement of said column address lines and with outputs of said demultiplexers being logically connected to enable inputs of the column decoder such that k columns of the memory cells are addressed thereby defining a word width of k bits wide.

8. A method for programming a field programmable memory cell array including a memory array composed of a sea of N memory cells addressed by a row decoder and a column decoder to input or output data by means of input/output circuits, input data control circuits and output data control circuits as determined by select/write enable logic, comprising the steps of programming an address decoder and an interconnect to selectively reconfigure the sea of N memory cells to $N/k \times k$ bits, where k is a power of two.

9. The programming method of claim 8, wherein the step of programming the address decoder comprises the steps of addressing enable inputs of the column decoder such that k columns of the memory cells are addressed thereby defining a word width of k bits wide.

10. The programming method of claim 9, wherein the step of programming the interconnect comprises the step of programming a plurality of switches connected between respective data lines of the input/output circuits to yield a word width of k bits wide.

* * * * *

(12) EX PARTE REEXAMINATION CERTIFICATE (8741st)
United States Patent
John

(10) Number: US 5,867,422 C1
(45) Certificate Issued: Dec. 13, 2011

(54) COMPUTER MEMORY CHIP WITH FIELD PROGRAMMABLE MEMORY CELL ARRAYS (FPMCAS), AND METHOD OF CONFIGURING

(75) Inventor: Lizy Kurian John, Tampa, FL (US)

(73) Assignee: University of South Florida, Tampa, FL (US)

Reexamination Request:
No. 90/008,853, Sep. 24, 2007

Reexamination Certificate for:
Patent No.: 5,867,422
Issued: Feb. 2, 1999
Appl. No.: 08/512,505
Filed: Aug. 8, 1995

(51) Int. Cl.
*G11C 7/10* (2006.01)

(52) U.S. Cl. ............... 365/168; 365/189.08; 365/189.14
(58) Field of Classification Search ...................... None
See application file for complete search history.

(56) References Cited

To view the complete listing of prior art documents cited during the proceeding for Reexamination Control Number 90/008,853, please refer to the USPTO's public Patent Application Information Retrieval (PAIR) system under the Display References tab.

*Primary Examiner* — Linh M. Nguyen

(57) ABSTRACT

A programmable memory circuit including the facility to reconfigure it's format.

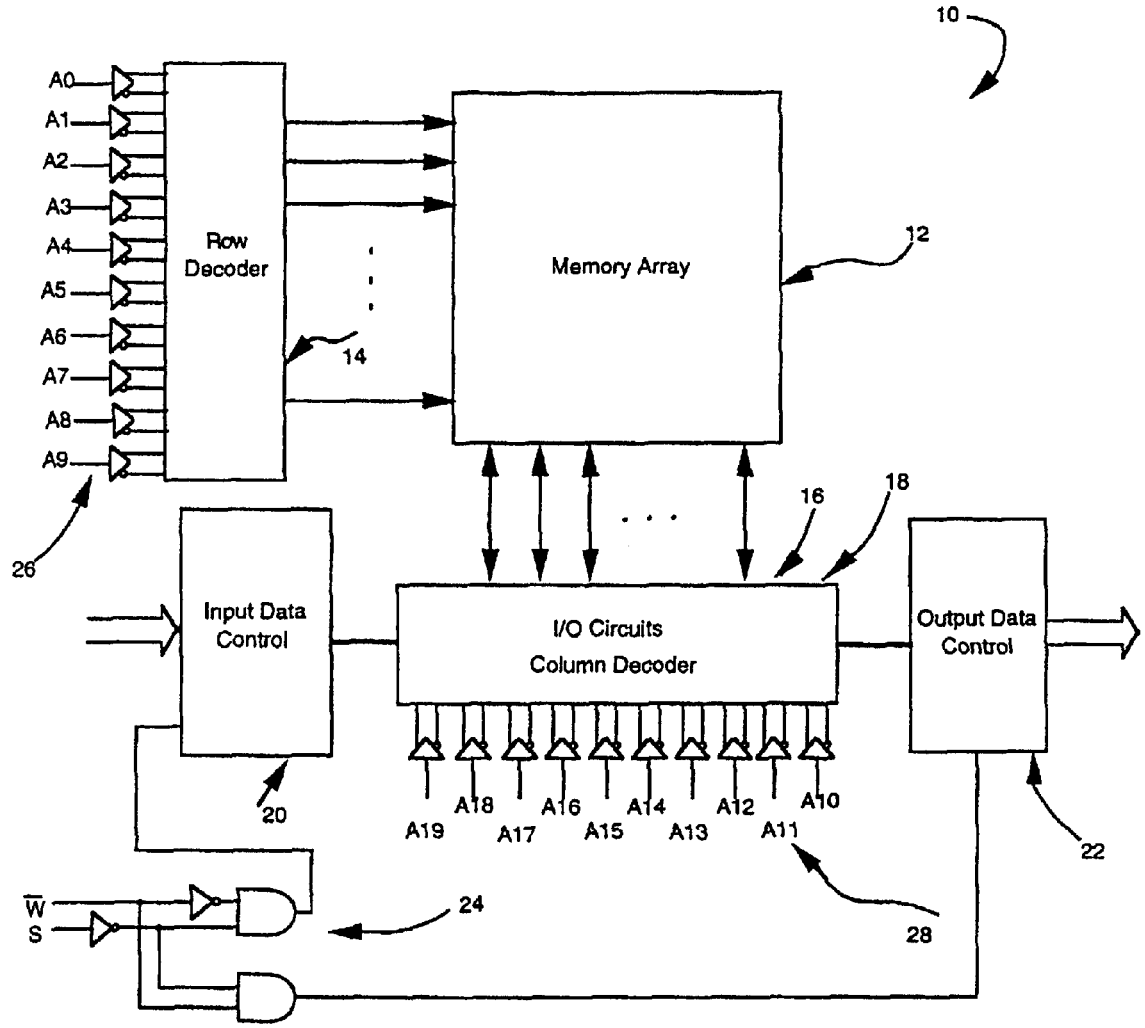

US 5,867,422 C1

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2-4 and 7 is confirmed.

Claims 1, 5, 6 and 8-10 are cancelled.

New claims 11-20 are added and determined to be patentable.

*11. A field programmable memory cell array including a memory array composed of a sea of N memory cells addressed by a row decoder and a column decoder to input or output data by means of input/output circuits, input data control circuits and output data control circuits as determined by select/write enable logic, comprising in combination:*

*a programmable address decoder comprising a plurality of mode control lines respectively connected to control inputs of a plurality of paired multiplexers, with one data input of each of said paired multiplexers being respectively connected to four column address lines and the other data input of each of said paired multiplexers being respectively connected to the complement of said column address lines and with outputs of said multiplexers being logically connected to enable inputs of the column decoder such that k columns of the memory cells are addressed thereby defining a word width of k bits wide; and*

*a programmable interconnect; for selective reconfiguration of the sea of N memory cells to at least N×1bit, N/2×2 bits, and N/4×4 bits.*

*12. The field programmable memory cell array of claim 11, wherein said programmable interconnect is comprised of switches electrically connected between data lines and with control inputs of the switches respectively connected to the plurality of mode control lines and the switches are selected from the group consisting of transmission gates, and PASS transistors.*

*13. The field programmable memory cell array of claim 11, wherein the field programmable memory cell array is selectively reconfigurable to at least N×1 bit, N/2×2 bits, N/4×4 bits, N/8×8 bits, and N/16 ×16 bits.*

*14. The field programmable memory cell array of claim 11, further comprising a mode control register coupled to the plurality of mode control lines.*

*15. A method for programming a field programmable memory cell array including a memory array composed of a sea of N memory cells addressed by a row decoder and a column decoder to input or output data by means of input/output circuits, input data control circuits and output data control circuits as determined by select/write enable logic, comprising the steps of programming:*

*an address decoder comprising a plurality of mode control lines respectively connected to control inputs of a plurality of paired muliplexers, with one data input of each of said paired multiplexers being respectively connected to four column address lines and the other data input of each paired multiplexers being respectively connected to the complement of said column address lines and with outputs of said multiplexers being logically connected to enable inputs of the column decoder such that k columns of the memory cells are addressed thereby defining a word width of k bits wide; and*

*an interconnect;*

*to selectively reconfigure the sea of N memory cells to at least N×1 bit, N/2×2 bits, and N/4×4 bits.*

*16. The field programmable memory cell array of claim 15, wherein the interconnect comprises a plurality of switches electrically connected between data lines with control inputs respectively connected to the plurality of mode control lines and said switches are selected from the group consisting of transmission gates, and PASS transistors.*

*17. The method in claim 15 wherein programming further comprises programming a mode control register to selectively reconfigure the word width of the memory array to at least N×1 bit, N/2×2 bits, N/4×4 bits, N/8×8 bits, and N/16× 16 bits.*

*18. A field programmable memory cell array composed of a sea of N memory cells addressed by a row decoder and a column decoder to input or output data by means of input/output circuits, input data control circuits and output data control circuits as determined by select/write enable logic, comprising in combination,*

*a programmable address decoder; and*

*a programmable interconnect; for selective reconfiguration of the sea of N memory cells to at least N×1 bit, N/2×2 bits, and N/4×4 bits.*

*19. The field programmable memory cell array of claim 18, wherein;*

*the programmable address decoder comprises a column decoder having a plurality of multiplexers each with an input connected to one of a first plurality of column address lines, and with another input connected to a static logic signal, each of a plurality of multiplexer control inputs connected to a plurality of mode control lines, each of a plurality of multiplexer outputs logically connected to an enable input of a plurality of decoders, each decoder having a plurality of inputs respectively connected to a second plurality of address lines, and each decoder output respectively coupled to a column enable line of the memory array.*

*20. The field programmable memory cell array of claim 18, wherein;*

*the programmable interconnect comprises at least sixteen data lines having at least fifteen switches, each of the switches connected between two of the sixteen data lines, and each of the switches control input connected to a mode control line.*

\* \* \* \* \*

US005867422C2

(12) EX PARTE REEXAMINATION CERTIFICATE (10549th)
United States Patent
John

(10) Number: US 5,867,422 C2
(45) Certificate Issued: Mar. 24, 2015

(54) COMPUTER MEMORY CHIP WITH FIELD PROGRAMMABLE MEMORY CELL ARRAYS (FPMCAS), AND METHOD OF CONFIGURING

(75) Inventor: Lizy Kurian John, Tampa, FL (US)

(73) Assignee: Lizy John, Austin, TX (US)

Reexamination Request:
No. 90/012,396, Jul. 17, 2012

Reexamination Certificate for:
Patent No.: 5,867,422
Issued: Feb. 2, 1999
Appl. No.: 08/512,505
Filed: Aug. 8, 1995

Reexamination Certificate C1 5,867,422 issued Dec. 13, 2011

(51) Int. Cl.
*G11C 13/00* (2006.01)
*G11C 7/10* (2006.01)

(52) U.S. Cl.
CPC .................................. *G11C 7/1006* (2013.01)
USPC .................. 365/168; 365/189.01; 365/189.08

(58) Field of Classification Search
None
See application file for complete search history.

(56) References Cited

To view the complete listing of prior art documents cited during the proceeding for Reexamination Control Number 90/012,396, please refer to the USPTO's public Patent Application Information Retrieval (PAIR) system under the Display References tab.

*Primary Examiner* — Yuzhen Ge

(57) ABSTRACT

A programmable memory circuit including the facility to reconfigure it's format.

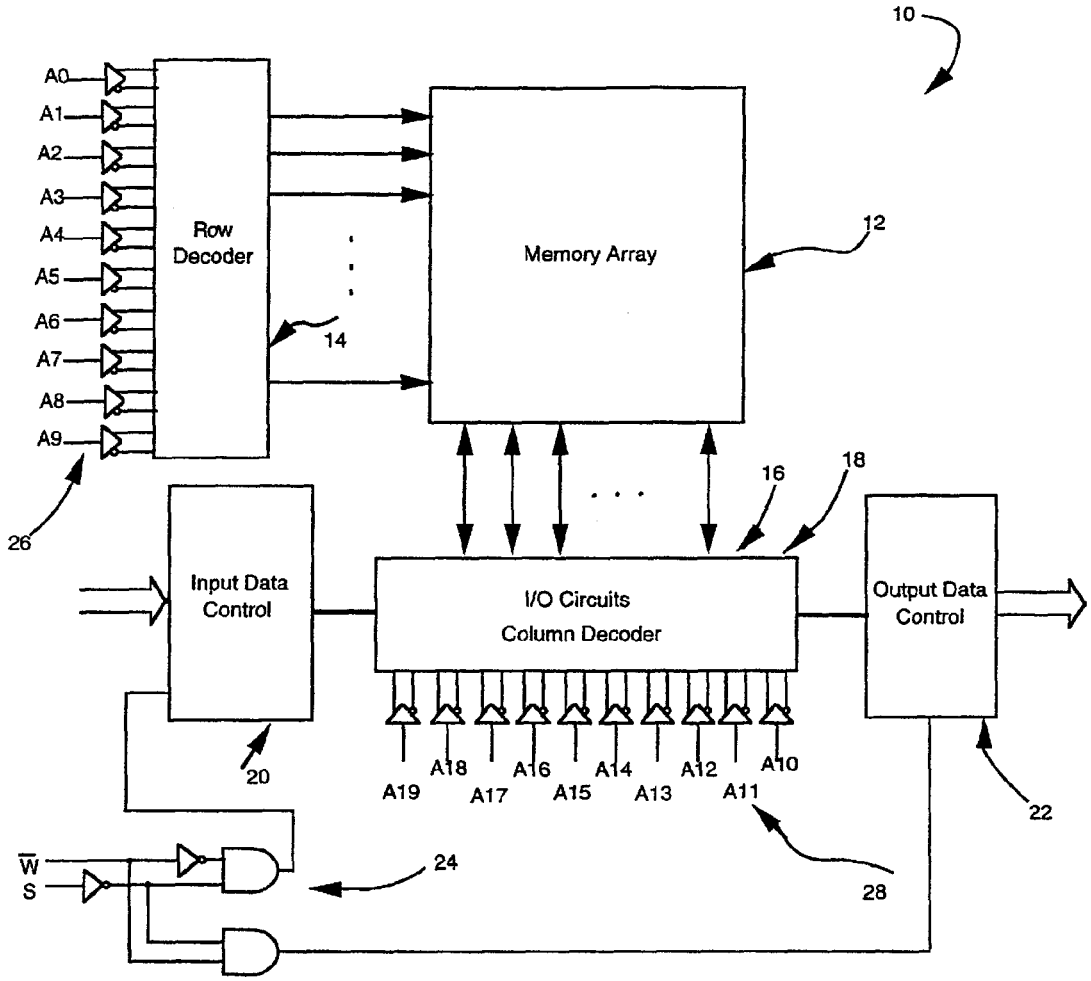

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 5-6 and 8-10 were previously cancelled.

Claim 18 is cancelled.

Claim 20 is determined to be patentable as amended.

New claims 21-29 are added and determined to be patentable.

Claims 2-4, 7, 11-17 and 19 were not reexamined.

20. The field programmable memory cell array of claim 18, wherein;
   *a programmable address decoder including multiplexers and a decoder, with an input of each multiplexer being respectively connected to an address line and outputs of the multiplexers being logically connected to a decoder input, and at least another address line also logically connected to the decoder;*
   the programmable interconnect comprises at least sixteen data lines having at least fifteen switches, each of the switches connected between two of the sixteen data lines, and each of the switches control input connected to a mode control line.

21. *A field programmable memory cell array composed of a sea of N memory cells addressed by a row decoder and a column decoder to input or output data by means of input/output circuits, input data control circuits and output data control circuits as determined by select/write enable logic, comprising in combination,*
   *the column decoder is a programmable address decoder comprising multiplexers and at least one decoder with each multiplexer output logically coupled to the at least one decoder which has outputs respectively connected to array columns to selectively activate 1, 2, 4, 8 and 16 array columns; and*
   *a programmable interconnect;*
   *for selective reconfiguration of the sea of N memory cells to at least N×1 bit, N/2×2 bits, N/4×4 bits, N/8×8 bits, and N/16×16 bits.*

22. *The field programmable memory cell array of claim 21 wherein,*
   *the at least one decoder is an address decoder and further comprising mode control lines and column address lines respectively connected to the multiplexers, with outputs of said multiplexers being logically connected to the address decoder such that 1, 2, 4, 8, and 16 columns of the memory cells are addressed thereby defining a word width of 1, 2, 4, 8, and 16 bits wide.*

23. *The field programmable memory cell array of claim 22 wherein,*
   *the programmable address decoder is programmed by logic states on mode control lines.*

24. *The field programmable memory cell array of claim 21 wherein,*
   *the programmable address decoder is programmed by logic states in a mode control register coupled to the mode control lines.*

25. *A field programmable memory cell array composed of a sea of N memory cells addressed by a row decoder and a column decoder to input or output data by means of input/output circuits, input data control circuits and output data control circuits as determined by select/write enable logic, comprising in combination,*
   *the column decoder is a programmable address decoder having multiplexers with one input of each multiplexer respectively connected to an address line and outputs of the multiplexers logically connected to at least one decoder that has address lines as inputs and the decoder outputs are respectively connected to the memory cell array to selectively activate 1, 2, and 4 columns; and*
   *a programmable interconnect;*
   *for selective reconfiguration of the sea of N memory cells to at least N×1 bit, N/2×2 bits, and N/4×4 bits.*

26. *The field programmable memory cell array of claim 25 wherein,*
   *the at least one decoder further comprising outputs respectively connected to the memory cell array to selectively activate 1, 2, 4, 8 and 16 columns for selective reconfiguration of the sea of N memory cells to at least N×1 bit, N/2×2 bits, N/4×4 bits, N/8×8 bits, and N/16×16 bits.*

27. *The field programmable memory cell array of claim 25 wherein,*
   *the at least one decoder further comprising mode control lines and column address lines respectively connected to multiplexers, with outputs of said multiplexers being logically connected to the at least one decoder such that 1, 2, 4, 8, or 16 columns of the memory cells are addressed thereby defining a word width of 1, 2, 4, 8, or 16 bits wide.*

28. *The field programmable memory cell array of claim 27 wherein,*
   *the programmable address decoder is programmed by logic states in a mode control register coupled to the mode control lines.*

29. *The field programmable memory cell array of claim 25 wherein,*
   *the multiplexers are logically connected to at least two decoders that have address lines as inputs and the programmable address decoder is programmed by logic states on mode control lines.*

\* \* \* \* \*